United States Patent
Kanki et al.

(10) Patent No.: US 11,601,091 B1
(45) Date of Patent: Mar. 7, 2023

(54) FLUCTUATION OSCILLATOR AND SIGNAL SENSING DEVICE

(71) Applicant: OSAKA UNIVERSITY, Osaka (JP)

(72) Inventors: Teruo Kanki, Osaka (JP); Yasushi Hotta, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 0 days.

(21) Appl. No.: 17/793,180

(22) PCT Filed: Dec. 28, 2020

(86) PCT No.: PCT/JP2020/049135
§ 371 (c)(1),
(2) Date: Jul. 15, 2022

(87) PCT Pub. No.: WO2021/153146
PCT Pub. Date: Aug. 5, 2021

(30) Foreign Application Priority Data

Jan. 27, 2020 (JP) .............................. JP2020-010951

(51) Int. Cl.
*H03B 21/00* (2006.01)
*H03K 3/84* (2006.01)
*H03K 4/08* (2006.01)
*H03B 29/00* (2006.01)

(52) U.S. Cl.
CPC .............. *H03B 21/00* (2013.01); *H03B 29/00* (2013.01); *H03K 3/84* (2013.01); *H03K 4/08* (2013.01)

(58) Field of Classification Search
CPC ........... H03B 21/00; H03B 29/00; H03K 3/84
USPC ........................................................ 331/78
See application file for complete search history.

(56) References Cited

U.S. PATENT DOCUMENTS

| | | | |
|---|---|---|---|
| 3,304,515 A * | 2/1967 | Stieler ....................... | G01S 1/02 74/567 |
| 10,404,237 B2 * | 9/2019 | Kanki ....................... | H03K 3/84 |
| 2011/0068875 A1 * | 3/2011 | Hotta .................... | H03K 3/0315 331/57 |
| 2018/0254770 A1 | 9/2018 | Kanki et al. | |

FOREIGN PATENT DOCUMENTS

WO    2017/033962    3/2017

OTHER PUBLICATIONS

International Search Report dated Mar. 16, 2021 in International (PCT) Application No. PCT/JP2020/049135.

* cited by examiner

*Primary Examiner* — William Hernandez
(74) *Attorney, Agent, or Firm* — Wenderoth, Lind & Ponack, L.L.P.

(57) ABSTRACT

A fluctuating oscillator includes: an adder that has an input terminal to which an input signal including a main signal and an uncorrelated signal that is uncorrelated with the main signal and is higher in frequency than the main signal is input, and adds a feedback signal to the input signal; a threshold discrimination unit that generates a pulse signal by comparing an addition signal added by the adder with a threshold; a transient response unit that generates an output signal by transiently responding the generated pulse signal; and a feedback loop that feeds back the output signal to the adder as the feedback signal.

4 Claims, 5 Drawing Sheets

FLUCTUATION OSCILLATOR AND SIGNAL SENSING DEVICE

TECHNICAL FIELD

The present invention relates to a fluctuating oscillator and a signal sensing device including the fluctuating oscillator.

BACKGROUND ART

There is known a fluctuating oscillator, which is an oscillator using a stochastic resonance phenomenon in which a signal is boosted and a reaction is improved under a certain probability by adding noise to the signal. Since the fluctuating oscillator oscillates with fluctuation such as 1/f fluctuation, it is possible to achieve comfortable control for a human such as flickering a lighting device like a firefly or biologically moving a robot. Furthermore, the fluctuating oscillator can also be used as a sensor that senses a weak signal buried in noise. Since the conventional fluctuating oscillator includes an analog circuit, it has been required to flexibly adjust circuit parameters such as a resistor and a capacitor in order to oscillate the fluctuating oscillator at a desired frequency.

Therefore, Patent Literature 1 discloses a fluctuating oscillator that can flexibly adjust circuit parameters. Specifically, Patent Literature 1 discloses a fluctuating oscillator including a noise generator, an adder that adds, to an input signal, a noise signal generated by the noise generator and a transient response signal to be fed back, a threshold discrimination unit that generates a pulse signal by comparing an addition signal output from the adder with a threshold, a transient response unit that causes transient response of the pulse signal, a feedback loop that feeds back the transient response signal from the transient response unit, and an intensity adjustment unit that adjusts intensity of the transient response signal flowing through the feedback loop.

However, since the fluctuating oscillator of Patent Literature 1 includes a noise generator, there is a problem that the circuit scale increases and the cost also increases accordingly. Furthermore, since the noise generator is provided, there is also a problem that the power consumption increases. Furthermore, when the natural frequency of the fluctuating oscillator is adjusted, work of adjusting the circuit parameters such as the threshold of the threshold discrimination unit and the time constant of the transient response unit is required. However, if there is a noise generator, it is also required to adjust the level of the noise signal generated by the noise generator, and there is a problem that it takes time and effort to adjust the circuit parameters.

CITATION LIST

Patent Literature

Patent Literature 1: WO 2017/033962 A

SUMMARY OF INVENTION

An object of the present invention is to provide a fluctuating oscillator that does not require a noise generator.

A fluctuating oscillator according to an aspect of the present invention includes: an adder that has an input terminal to which an input signal including a main signal and an uncorrelated signal that is uncorrelated with the main signal and is higher in frequency than the main signal is input, and adds a feedback signal to the input signal; a threshold discrimination unit that generates a pulse signal by comparing an addition signal added by the adder with a threshold; a transient response unit that generates an output signal by transiently responding the generated pulse signal; and a feedback loop that feeds back the output signal to the adder as the feedback signal.

According to the present invention, it is possible to omit the noise generator from the fluctuating oscillator. This makes it possible to reduce the circuit scale of the fluctuating oscillator and to reduce the cost. Furthermore, since there is no noise generator, it is possible to save time and effort to adjust the level of the noise signal when adjusting circuit parameters.

DESCRIPTION OF EMBODIMENTS

The signal such as an electroencephalogram signal includes a signal uncorrelated with the main signal in addition to the main signal indicating the electroencephalogram itself. It has been found that when such a signal is input to the fluctuating oscillator, if the frequency of the uncorrelated signal is higher than the frequency of the main signal, the uncorrelated signal acts as a noise signal, stochastic resonance is generated, and the weak main signal can be sensed. In this case, it becomes possible to omit the noise generator from the fluctuating oscillator.

The present invention has been made based on such findings.

Embodiments of the present invention will be described below with reference to the accompanying drawings. Note that the following embodiments are examples embodying the present invention and are not intended to limit the technical scope of the present invention.

First Embodiment

Figure 1:
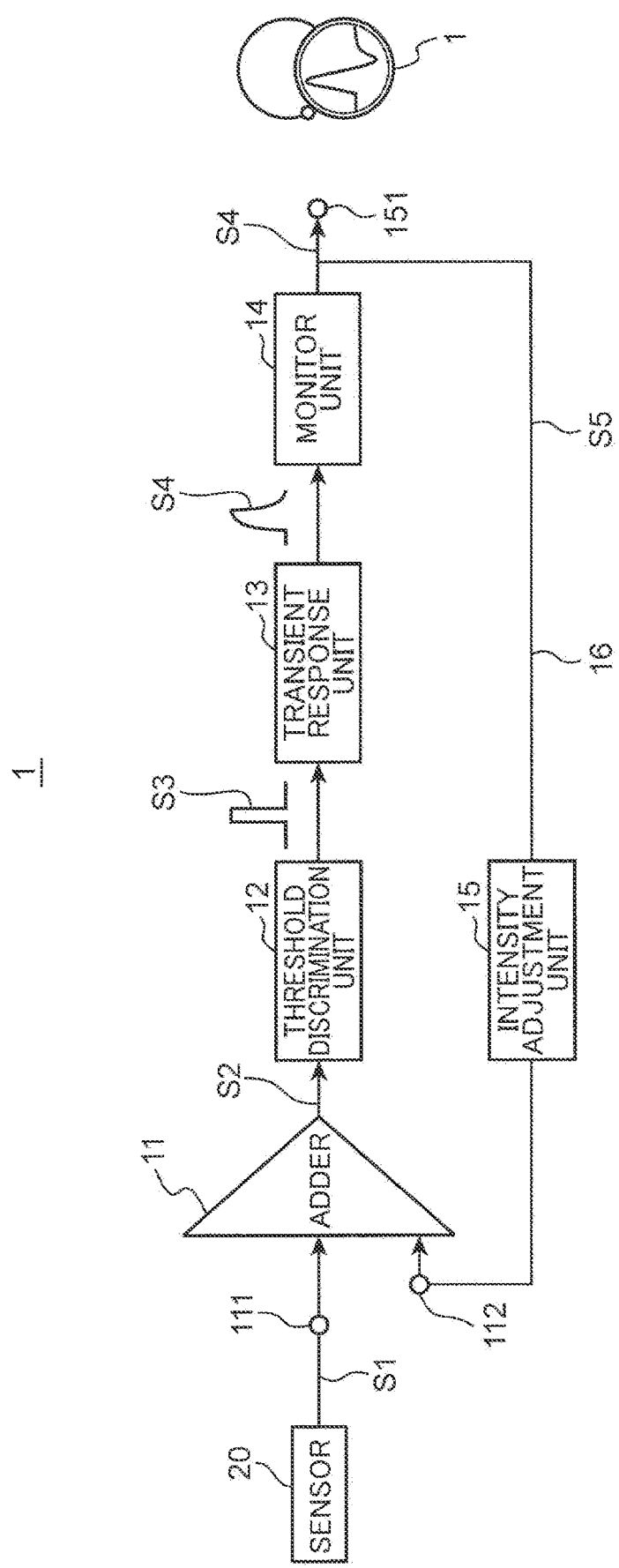
FIG. 1 is a view illustrating an example of a configuration of a fluctuating oscillator according to a first embodiment of the present invention.

FIG. 1 is a view illustrating an example of the configuration of a fluctuating oscillator 1 according to the first embodiment of the present invention. As illustrated in FIG. 1, the fluctuating oscillator 1 includes an adder 11, a threshold discrimination unit 12, a transient response unit 13, a monitor unit 14, an intensity adjustment unit 15, and a feedback loop 16.

The adder 11 has an input terminal 111 to which an input signal S1 is input and a feedback terminal 112 to which a feedback signal S5 is input, and adds the input signal S1 and the feedback signal S5 to be output from the intensity adjustment unit 15. The adder 11 includes, for example, an analog adder circuit.

The input signal S1 is a signal including the main signal and the uncorrelated signal that is uncorrelated with the main signal and is higher in frequency than the main signal. In the present embodiment, an electroencephalogram signal sensed by a sensor 20 is adopted as the input signal S1. The electroencephalogram signal is a weak signal including the main signal indicating the electroencephalogram itself and the uncorrelated signal higher in frequency than the main signal. Therefore, the electroencephalogram signal is a signal suitable for signal sensing by the fluctuating oscillator 1. Note that this uncorrelated signal is a noise signal mixed in the electroencephalogram signal for some reason in the process of measuring the electroencephalogram signal.

The sensor 20 is an electroencephalogram sensor including a probe abutting on the head of a human. Here, the electroencephalogram signal is used as the input signal S1, but this is an example, and any signal may be adopted as long as the signal includes the main signal and the uncorrelated signal higher in frequency than the main signal. For example, a biosignal can be adopted as the input signal S1.

In the example of FIG. 1, only one input signal S1 is input to the adder 11, but the present invention is not limited to this, and a plurality of input signals may be input. In this case, the adder 11 is only required to have a plurality of input terminals corresponding to the plurality of input signals.

The threshold discrimination unit 12 compares an addition signal S2 output from the adder 11 with a predetermined threshold, and outputs a pulse signal S3 that becomes a high level when this addition signal S2 is equal to or greater than the threshold and becomes a low level when this addition signal S2 is less than the threshold. When the pulse signal S3 is at the high level, the fluctuating oscillator 1 enters a high state. When the pulse signal S3 is at the low level, the fluctuating oscillator 1 enters a low state.

The threshold may include a first threshold and a second threshold larger than the first threshold. In this case, the threshold discrimination unit 12 is only required to output the pulse signal S3 that is at the low level when the addition signal S2 falls below the first threshold in the high state. Due to this, the fluctuating oscillator 1 switches from the high state to the low state. The threshold discrimination unit 12 is only required to output the pulse signal S3 that is at the high level when the addition signal S2 exceeds the second threshold in the low state. Due to this, the fluctuating oscillator 1 switches from the low state to the high state. By configuring the threshold with the first threshold and the second threshold, it becomes possible to give hysteresis to the fluctuating oscillator 1. Thus, the configuration that gives hysteresis to the fluctuating oscillator 1 can be easily achieved by configuring the threshold discrimination unit 12 with a Schmitt trigger circuit.

The transient response unit 13 generates a transient response signal of the pulse signal S3 as an output signal S4 by transiently responding the pulse signal S3 output from the threshold discrimination unit 12. The transient response unit 13 includes, for example, an integrator or a differentiator. Alternatively, the transient response unit 13 may include an LCR circuit. The LCR circuit is a circuit in which a coil (L), a capacitor (C), and a resistor (R) are connected in series or connected in parallel. In this case, the transient response unit 13 outputs the output signal S4 having a transient response waveform of LCR that is a waveform changing logarithmically.

The monitor unit 14 monitors the output signal S4. In the present embodiment, the monitor unit 14 includes, for example, an information processing device such as a computer, and displays the waveform of the output signal S4 on a display or senses and displays, on the display, a frequency of the output signal S4. This allows the operator to grasp the input signal from the information displayed on the display.

The intensity adjustment unit 15 includes a variable resistor provided on the feedback loop 16, adjusts the intensity of the feedback signal S5, and inputs the feedback signal S5 to the adder 11.

The feedback loop 16 includes a line path provided between an output terminal 151 and the feedback terminal 112, and feeds back the output signal S4 to the adder 11 as the feedback signal S5.

The output terminal 151 is provided on the output side of the monitor unit 14, and outputs the output signal S4 to the outside.

In the present embodiment, the fluctuating oscillator 1 illustrated on the left side of FIG. 1 is represented using the symbol on the right side of FIG. 1. In FIG. 1, the fluctuating oscillator 1 includes the monitor unit 14, but the monitor unit 14 may be omitted. In this case, the feedback loop 16 is connected between the output terminal of the transient response unit 13 and the feedback terminal 112. The intensity adjustment unit 15 may be omitted.

The fluctuating oscillator 1 illustrated in FIG. 1 operates as follows. The adder 11 receives the input signal S1 including the main signal and the uncorrelated signal that is uncorrelated with the main signal and is higher in frequency than the main signal. This input signal S1 is added to the feedback signal S5 by the adder 11 and input to the threshold discrimination unit 12. In the threshold discrimination unit 12, the addition signal S2 output from the adder 11 is compared with a threshold, and the pulse signal S3 indicating the comparison result is generated. Since the addition signal S2 input to the threshold discrimination unit 12 includes an uncorrelated signal, this uncorrelated signal acts as a noise signal, and even if the main signal included in the input signal S1 is lower than the threshold, the addition signal S2 can stochastically exceed the threshold by stochastic resonance. The pulse signal S3 output from the threshold discrimination unit 12 is formed into the output signal S4 having a transient responsive waveform according to the time constant of the transient response unit 13. This output signal S4 is fed back to the adder 11 by the feedback loop 16. Due to this feedback, the fluctuating oscillator 1 eventually oscillates in synchronization with the main signal. Due to this, the weak main signal is accurately sensed.

Figure 2:
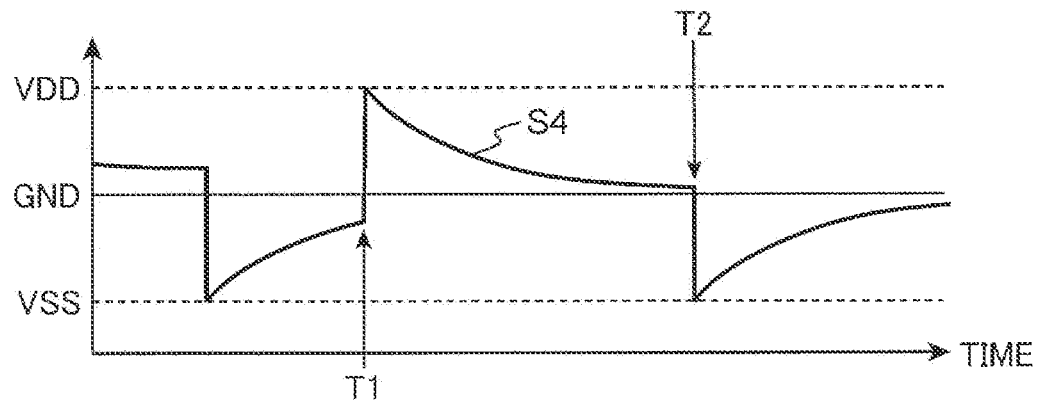
FIG. 2 is a waveform chart of an output signal in a case where a transient response unit includes a differentiator illustrated in FIG. 4.

FIG. 2 is a waveform chart of the output signal S4 when the transient response unit 13 includes a differentiator. In FIG. 2, the vertical axis represents voltage, and the horizontal axis represents time. At time T1, the addition signal S2 exceeds the threshold, and the pulse signal S3 becomes a high level. Therefore, the output signal S4 rises to a positive-side power supply voltage VDD all at once, and thereafter attenuates toward a ground level GND according to the time constant of the differentiator.

At time T2, the addition signal S2 falls below the threshold, and the pulse signal S3 becomes a low level. Therefore, the output signal S4 drops to a negative-side power supply voltage VSS all at once, and thereafter increases according to the time constant of the differentiator. Thereafter, the fluctuating oscillator 1 oscillates by repeating this behavior.

Figure 3:
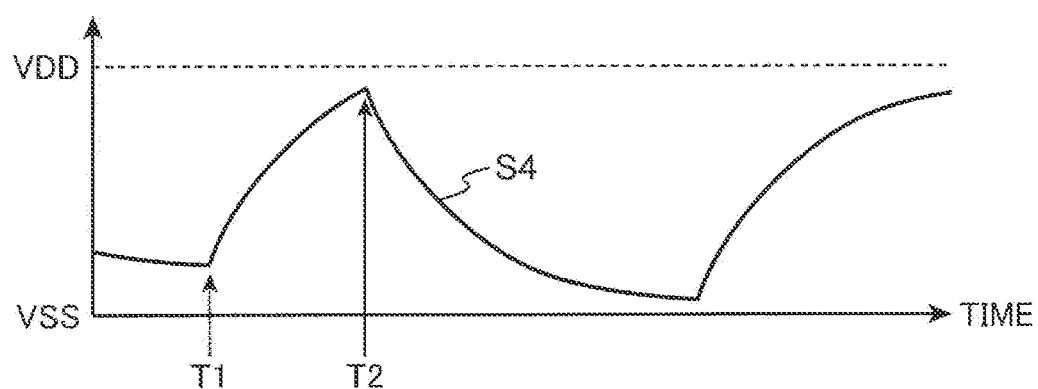
FIG. 3 is a waveform chart of an output signal in a case where the transient response unit includes an integrator.

FIG. 3 is a waveform chart of the output signal S4 in a case where the transient response unit 13 includes an integrator. In FIG. 3, the vertical axis represents voltage, and the horizontal axis represents time. At time T1, the addition signal S2 exceeds the threshold, and the pulse signal S3 becomes a high level. Therefore, the output signal S4 increases according to the time constant of the integrator.

At time T2, the addition signal S2 falls below the threshold, and the pulse signal S3 becomes a low level. Therefore, the output signal S4 attenuates according to the time constant of the integrator. Thereafter, the fluctuating oscillator 1 oscillates by repeating this behavior.

As illustrated in FIG. 3, the integrator can smoothly change the output signal S4 as compared with the differentiator. Therefore, when it is desired to cause a light-emitting element to emit light in a smooth light emission pattern or when it is desired to cause a control target object to operate in a smooth operation pattern, an integrator only needs to be adopted as the transient response unit 13. On the other hand, when it is desired to cause the light-emitting element to emit light in a light emission pattern in which dimming rapidly changes, or when it is desired to cause the control target to operate in an operation pattern in which operation rapidly changes, a differentiator only needs to be adopted as the transient response unit 13.

Figure 4:
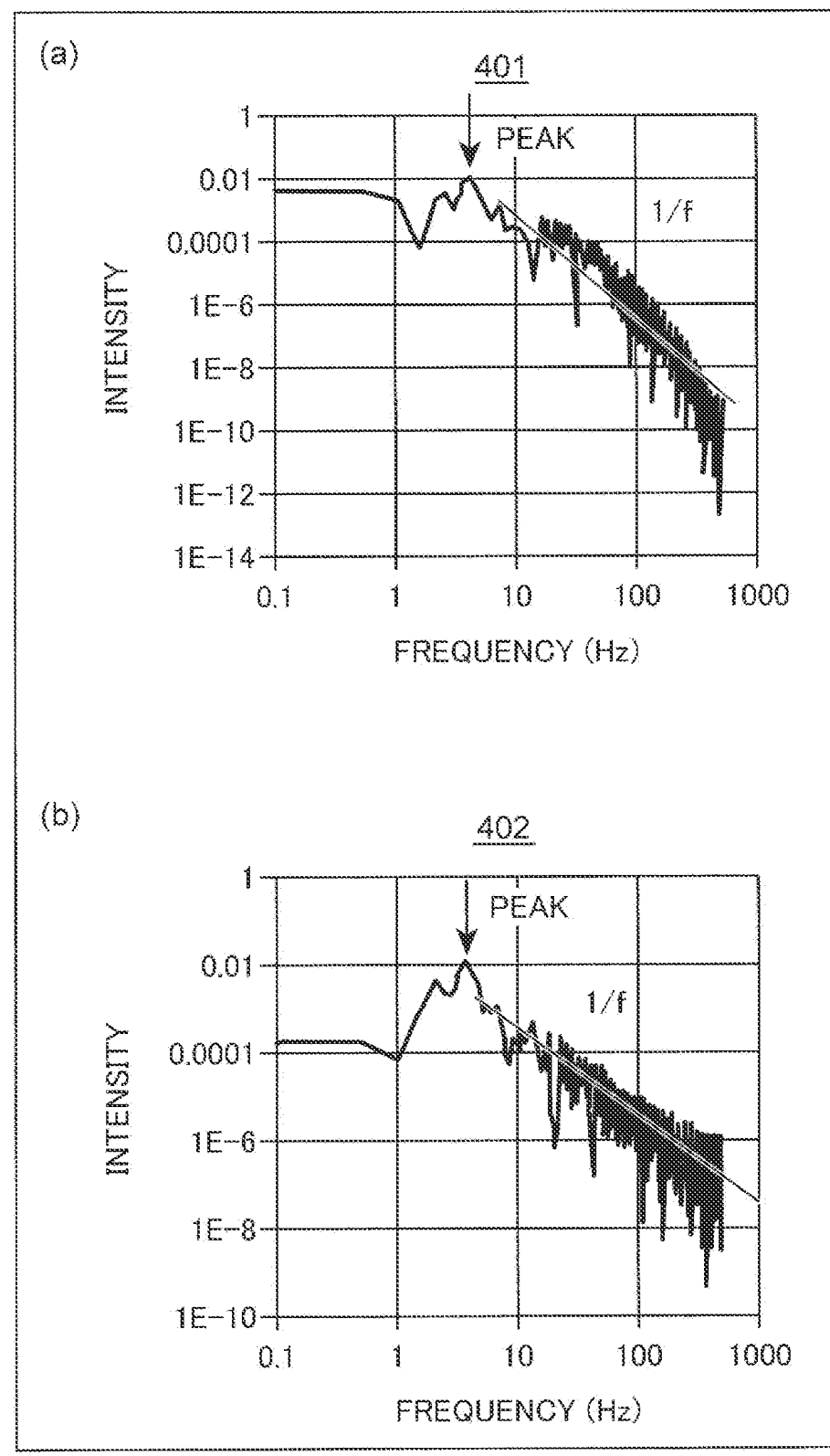
FIG. 4 is a graph indicating a frequency spectrum in a case where an electroencephalogram signal of a human is subjected to fast Fourier transform.

FIG. 4 is a graph indicating a frequency spectrum in a case where an electroencephalogram signal of a human is subjected to fast Fourier transform. In FIG. 4, (a) indicates a frequency spectrum 401 in a case of using the technique of the comparative example, and (b) indicates a frequency spectrum 402 in a case of using the technique of the present application.

The technique of the comparative example is a technique of observing a peak from the frequency spectrum 401 obtained by performing fast Fourier transform on the electroencephalogram signal sensed by the sensor 20. The technique of the present application is a technique of performing fast Fourier transform on the output signal S4 obtained by inputting, to the fluctuating oscillator 1, the electroencephalogram signal sensed by the sensor 20, and observing a peak from the obtained frequency spectrum 402. Note that each of the frequency spectra 401 and 402 is a double logarithmic graph, where the vertical axis indicates the intensity of the electroencephalogram signal, and the horizontal axis indicates the frequency.

Although the peak is observed in both the frequency spectra 401 and 402, it is indicated that a steeper peak is observed in the frequency spectrum 402 than in the frequency spectrum 401. Therefore, it is indicated that the technique of the present application can observe the peak more accurately than the technique of the comparative example.

In the technique of the comparative example, since the peak does not appear remarkably in the frequency spectrum, it is required to make the peak appear by performing signal processing such as filtering processing on the signal having been subjected to the fast Fourier transform. On the other hand, in the technique of the present application, since the peak appears remarkably, signal processing such as filtering processing is unnecessary, and the processing can be simplified.

Note that in both of the frequency spectra 401 and 402, the higher frequency side than the peak largely decreases linearly, and it is observed that the electroencephalogram signal has characteristics of 1/f fluctuation.

Figure 5:
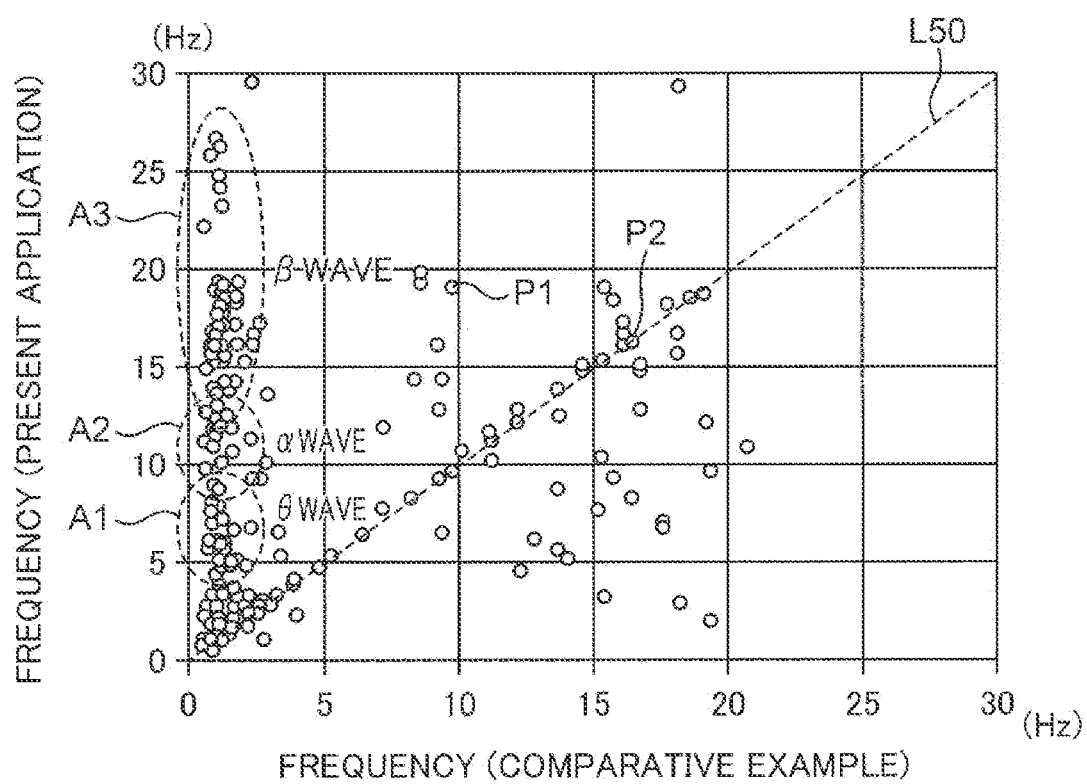
FIG. 5 is a graph comparing a peak frequency of an electroencephalogram signal sensed by the technique of the present application with a peak frequency of an electroencephalogram signal sensed by the technique of the comparative example.

FIG. 5 is a graph comparing a peak frequency of an electroencephalogram signal sensed by the technique of the present application with a peak frequency of an electroencephalogram signal sensed by the technique of the comparative example. The peak frequency refers to a frequency corresponding to a peak in the frequency spectra 401 and 402 illustrated in FIG. 4.

In FIG. 5, the vertical axis represents the peak frequency observed by the technique of the present application, and the horizontal axis represents the peak frequency observed by the technique of the comparative example. Note that in the technique of the present application, the natural frequency of the fluctuating oscillator 1 is set to 1 Hz, which is set to a frequency lower than the frequency band of the electroencephalogram.

For example, for an observation point P1, the value on the vertical axis is approximately 19 Hz, but the value on the horizontal axis is approximately 10 Hz, and there is a difference in the peak frequencies observed by the technique of the present application and the technique of the comparative example. Therefore, it is not possible to conclude which technique of the both techniques is accurate. On the other hand, it can be concluded that the peak frequencies observed by the technique of the present application and the technique of the comparative example substantially coincide with each other at an observation point positioned on a line L50 at an angle of 45 degrees as an observation point P2, and the peak frequencies can be sensed by the both techniques.

The part to be noted in this graph is observation points belonging to regions A1 to A3 encircled by dotted circles. For example, the observation points belonging to the region A1 have values on the vertical axis within the range of approximately 3.5 Hz to 9 Hz, and can be estimated to be observation points of a θ wave, but values on the horizontal axis is about 1 Hz, and it is difficult to regard that the peak frequency of the electroencephalogram has been successfully observed. Similarly, the observation points belonging to the region A2 have values on the vertical axis within the range of approximately 8 Hz to 14 Hz, and can be estimated to be an observation point group of an α wave, but values on the horizontal axis is 1 Hz, and it is difficult to regard that the peak frequency of the electroencephalogram has been successfully observed. The same applies to the observation points of a β wave where values on the vertical axis belonging to the region A3 are within the range of approximately 13 Hz to 28 Hz.

As described above, the graph indicated in FIG. 5 indicates that the peak frequencies of the θ wave, the α wave, and the β wave, which cannot be sensed in the comparative example, can be sensed by the technique of the present application. Therefore, even if the fluctuating oscillator 1 does not include a noise generator, it is possible to sense weak electroencephalograms that cannot be sensed by the technique of the comparative example.

The fluctuating oscillator 1 has a natural frequency. The natural frequency is an oscillation frequency of the fluctuating oscillator 1 when only a noise signal is input to the fluctuating oscillator 1. In order to sense a weak signal, it is necessary to set the natural frequency of the fluctuating oscillator 1 to be lower than the frequency of the input signal. The circuit parameters for adjusting the natural frequency include the threshold of the threshold discrimination unit, the time constant of the transient response unit, the gain of the intensity adjustment unit, and the level of the noise signal, and among these circuit parameters, the main parameter is the threshold of the threshold discrimination unit. Hereinafter, the work of adjusting the circuit parameter of the conventional fluctuating oscillator will be described with an example with the electroencephalogram signal as an input signal and the circuit parameter of the adjustment target as the threshold of the threshold discrimination unit. First, the electroencephalogram signal is input to the fluctuating oscillator, and the threshold of the threshold discrimination unit is adjusted so that the natural frequency becomes a frequency lower than the frequency of the electroencephalogram signal and suitable for sensing of the electroencephalogram signal. Next, the fluctuating oscillator is connected to the noise generator, the noise signal is input to the fluctuating oscillator, and the level of the noise signal is adjusted so that the natural frequency becomes a frequency lower than the frequency of the electroencephalogram and suitable for sensing of the electroencephalogram. Here, the level adjustment of the noise signal is necessary because the noise signal generated by the noise generator is further superimposed on the uncorrelated signal acting as the noise signal, so that the threshold of the threshold discrimination unit deviates from an appropriate value. Thus, in the conventional fluctuating oscillator, the natural frequency is adjusted mainly through two-stage adjustment.

On the other hand, in the fluctuating oscillator 1, the uncorrelated signal included in the electroencephalogram signal acts as a noise signal, and stochastic resonance occurs. Therefore, in the fluctuating oscillator 1, it is only necessary to input the electroencephalogram signal to the fluctuating oscillator 1 and to mainly perform the work of adjusting the threshold of the threshold discrimination unit 12 so that the natural frequency becomes a frequency lower than the frequency of the electroencephalogram and suitable for sensing of the electroencephalogram, and it is not necessary to perform the work of inputting the noise signal and adjusting the level of the noise signal thereafter. Therefore, the fluctuating oscillator 1 reduces time and effort required for the work of adjusting the circuit parameters.

As described above, according to the present embodiment, since the uncorrelated signal included in the input signal acts as a noise signal and stochastic resonance occurs, it is not necessary to use a noise generator for generating a noise signal as in the conventional fluctuating oscillator. Therefore, it is possible to omit the noise generator from the fluctuating oscillator. This makes it possible to reduce the circuit scale of the fluctuating oscillator and to reduce the cost. Furthermore, since there is no noise generator, it is possible to save time and effort to adjust the level of the noise signal when adjusting circuit parameters.

Second Embodiment

Figure 6:
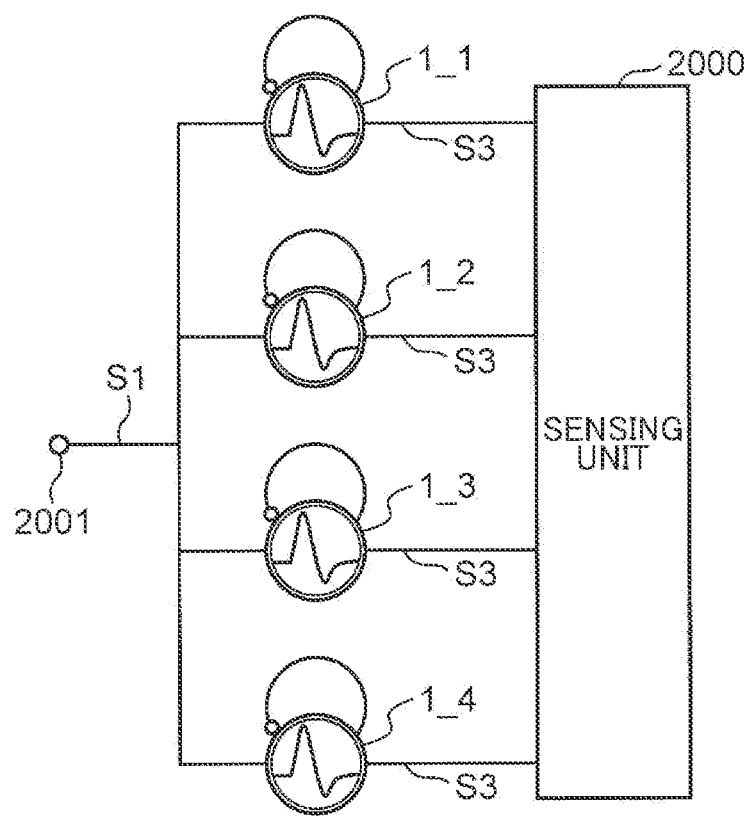
FIG. 6 is a view illustrating an overall configuration of a signal sensing device.

The second embodiment is characterized in that a signal sensing device that senses an unknown input signal S1 is configured by using a plurality of the fluctuating oscillators 1. FIG. 6 is a view illustrating an overall configuration of a signal sensing device 2. In the present embodiment, the identical components as those in the first embodiment are given the identical reference numerals, and description will be omitted.

The signal sensing device 2 includes the plurality of fluctuating oscillators 1 and a sensing unit 2000. In the example of FIG. 6, the fluctuating oscillator 1 includes four fluctuating oscillators 1_1, 1_2, 1_3, and 14. However, this is an example, and the signal sensing device 2 may include a plurality of fluctuating oscillators 1 other than the four fluctuating oscillators 1.

Input terminals of the fluctuating oscillators 1_1 to 1_4 are connected to a common input terminal 2001, and the common input signal S1 is input. The fluctuating oscillators 1_1 to 1_4 have circuit parameters adjusted to have different natural frequencies.

The sensing unit 2000 is connected to output terminals of the fluctuating oscillators 1_1 to 1_4, and includes an information processing device such as a computer. Then, the sensing unit 2000 receives the output signal S4 of each of the fluctuating oscillators 1_1 to 1_4.

The synchronization state of the fluctuating oscillator 1 includes incomplete synchronization and complete synchronization as indicated in Patent Literature 1. The incomplete synchronization refers to a synchronization state in which the fluctuating oscillator 1 oscillates in a state where the frequency varies to some extent. The complete synchronization refers to a synchronization state in which the fluctuating oscillator 1 oscillates in a state where the frequency varies little. In order to cause the incomplete synchronization and the complete synchronization, the fluctuating oscillator 1 is required to have a natural frequency lower than the frequency of the input signal.

In the incomplete synchronization, when the unknown input signal S1 is input to the fluctuating oscillator 1, the fluctuating oscillator 1 oscillates at a frequency in which the frequency is shifted from the natural frequency by a frequency shift amount. The closer the frequency of the input signal is to the natural frequency of the fluctuating oscillator 1, the larger this frequency shift amount becomes.

On the other hand, in the complete synchronization, the frequency (oscillation frequency) of the output signal S4 of the fluctuating oscillator 1 becomes the same as the frequency of the main signal included in the input signal S1. Therefore, by sensing the frequency of the output signal S4, it is possible to sense the frequency of the input signal S1.

Therefore, in a case of the incomplete synchronization, in a case where the frequency shift amount is observed, the fluctuating oscillator 1 can sense that the main signal having a frequency equal to or higher than the natural frequency has been input, and in a case where the frequency shift amount is not observed, the fluctuating oscillator 1 can sense that the input signal S1 having a frequency equal to or higher than the natural frequency has not been input.

Therefore, in the signal sensing device 2 of FIG. 6, if the synchronization states of all of the fluctuating oscillators 1_1 to 1_4 are the incomplete synchronization, it can be estimated that the frequency or the input signal S1 has a value closest to the natural frequency of the fluctuating oscillator 1 having the largest frequency shift amount among the fluctuating oscillators 1_1 to 1_4.

For example, assume that the natural frequencies of the fluctuating oscillators 1_1 to 1_4 are "5 Hz", "10 Hz", "15 Hz", and "20 Hz", respectively, and the input signal S1 including a main signal having a frequency of "17 Hz" is input. In this case, the frequency shift amount is observed in the fluctuating oscillators 1_1 to 1_3 whose natural frequency is lower than the frequency of the main signal. Furthermore, in this case, the frequency shift amount of the fluctuating oscillator 1 having the natural frequency "15 Hz" closest to the frequency of the input signal S1 among the fluctuating oscillators 1_1 to 1_3 is maximized. Therefore, in the signal sensing device 2, in the case where the synchronization states of all of the fluctuating oscillators 1_1 to 1_4 are incomplete synchronization, it can be estimated that the main signal included in the input signal has a frequency close to the natural frequency of the fluctuating oscillator 1 having the maximum frequency shift amount.

If the synchronization state of the fluctuating oscillator 1 of any one of the fluctuating oscillators 1_1 to 1_4 is complete synchronization, it can be estimated that the frequency of the main signal has the frequency of the output signal S4 of the fluctuating oscillator 1 completely synchronized.

Thus, according to the signal sensing device 2 of the second embodiment, since the plurality of fluctuating oscillators 1 having different natural frequencies are included, even in a case where all the fluctuating oscillators 1 cannot be completely synchronized with the input signal S1, the frequency of the input signal S1 can be estimated from the natural frequency of the fluctuating oscillator 1 having the maximum frequency shift amount. According to the signal sensing device 2 of the second embodiment, in a case where any of the fluctuating oscillators 1 is completely synchronized with the input signal S1, the frequency of the input signal S1 can be estimated from the frequency of the output signal S4 of the fluctuating oscillator 1.

Summary of Embodiments

A fluctuating oscillator according to an aspect of the present invention includes: an adder that has an input terminal to which an input signal including a main signal and an uncorrelated signal that is uncorrelated with the main signal and is higher in frequency than the main signal is input, and adds a feedback signal to the input signal; a threshold discrimination unit that generates a pulse signal by comparing an addition signal added by the adder with a threshold; a transient response unit that generates an output signal by transiently responding the generated pulse signal; and a feedback loop that feeds back the output signal to the adder as the feedback signal.

According to this configuration, the adder receives the input signal including the main signal and the uncorrelated signal that is uncorrelated with the main signal and is higher in frequency than the main signal. This input signal is added to the feedback signal by the adder and input to the threshold discrimination unit. In the threshold discrimination unit, the addition signal output from the adder is compared with a threshold, and the pulse signal indicating the comparison result is generated. Since the addition signal input to the threshold discrimination unit includes an uncorrelated signal, this uncorrelated signal acts as a noise signal, and the addition signal can stochastically exceed the threshold by stochastic resonance. The pulse signal output from the threshold discrimination unit is formed into the output signal having a transient responsive waveform by the transient response unit. This output signal is fed back to the adder by the feedback loop. Due to this feedback, the fluctuating oscillator eventually oscillates in synchronization with the main signal. Due to this, the weak main signal is accurately sensed.

Thus, in the present configuration, since the stochastic resonance occurs based on the uncorrelated signal included in the input signal, it is not necessary to use a noise generator for generating a noise signal as in the conventional fluctuating oscillator. Therefore, it is possible to omit the noise generator from the fluctuating oscillator. This makes it possible to reduce the circuit scale of the fluctuating oscillator and to reduce the cost. Furthermore, since there is no noise generator, it is possible to save time and effort to adjust the level of the noise signal when adjusting circuit parameters.

In the fluctuating oscillator, the input signal is preferably an electroencephalogram signal.

The electroencephalogram signal is a signal including the main signal indicating the electroencephalogram itself and the uncorrelated signal higher in frequency than the main signal. Therefore, the present configuration can accurately sense a weak electroencephalogram without using a noise generator.

The fluctuating oscillator preferably has a natural frequency lower than the frequency of the main signal.

The fluctuating oscillator that feeds back an output signal to an input signal has a characteristic in which the frequency shift amount (shift amount of the frequency of the output signal with respect to the natural frequency) can be observed in a case where an input signal including a main signal having a frequency higher than the natural frequency is input, but the frequency shift amount cannot be observed in a case where a main signal having a frequency lower than the natural frequency is input. It becomes possible to detect a weak signal based on this frequency shift amount. In the present configuration, since the natural frequency of the fluctuating oscillator is set to be lower than the frequency of the main signal that becomes the sensing target, it is possible to cause the fluctuating oscillator to sense a weak main signal.

In the present configuration, since the circuit parameters are adjusted so that the natural frequency of the fluctuating oscillator becomes lower than the frequency of the main signal that becomes the sensing target, it is possible to cause the fluctuating oscillator to sense a main signal. In a case where a main signal having a frequency lower than the natural frequency is input, since the fluctuating oscillator cannot sense the main signal, it is possible to cause the fluctuating oscillator to have a function of a high-pass filter.

In a signal sensing device according to another aspect of the present invention, each of the fluctuating oscillators has a different natural frequency and receives a common input signal, and the signal sensing device includes a sensing unit that senses a frequency of the input signal based on an output signal from each fluctuating oscillator.

The fluctuating oscillator has a characteristic that when the frequency of the main signal included in the input signal is higher than the natural frequency, the closer the frequency of the main signal gets to the natural frequency, the larger the frequency shift amount becomes. Therefore, it can be estimated that the frequency of the main signal is close to the natural frequency of the fluctuating oscillator having the maximum frequency shift amount. In the present configuration, since the plurality of fluctuating oscillators having different natural frequencies are provided, the frequency of an unknown main signal can be sensed using the natural frequency of the fluctuating oscillator in which the maximum frequency shift amount is observed.

The invention claimed is:
1. A fluctuating oscillator comprising;
an adder that has an input terminal to which an input signal including a main signal and an uncorrelated signal that is uncorrelated with the main signal and is higher in frequency than the main signal is input, and adds a feedback signal to the input signal;
a threshold discrimination unit that generates a pulse signal by comparing an addition signal added by the adder with a threshold;
a transient response unit that generates an output signal by transiently responding to the generated pulse signal; and
a feedback loop that feeds back the output signal to the adder as the feedback signal.
2. The fluctuating oscillator according to claim 1, wherein the input signal is an electroencephalogram signal.

3. The fluctuating oscillator according to claim 1, wherein the fluctuating oscillator has a natural frequency lower than a frequency of the main signal.

4. A signal sensing device comprising a plurality of the fluctuating oscillators according to claim 1,
- wherein each of the fluctuating oscillators has a different natural frequency and receives a common input signal, and
- the signal sensing device includes a sensing unit that senses a frequency of the input signal based on an output signal from each fluctuating oscillator.

* * * * *